United States Patent [19]

Pande

[11] Patent Number: 4,611,388

[45] Date of Patent: Sep. 16, 1986

[54] METHOD OF FORMING AN INDIUM PHOSPHIDE-BORON PHOSPHIDE HETEROJUNCTION BIPOLAR TRANSISTOR

[75] Inventor: Krishna P. Pande, Columbia, Md.

[73] Assignee: Allied Corporation, Morristown, N.J.

[21] Appl. No.: 723,423

[22] Filed: Apr. 15, 1985

Related U.S. Application Data

[62] Division of Ser. No. 484,762, Apr. 14, 1983, Pat. No. 4,529,996.

[51] Int. Cl.$^4$ .................. H01L 21/20; H01L 21/265
[52] U.S. Cl. ......................... 29/576 E; 29/576 B; 29/578; 29/580; 148/1.5; 148/175; 148/DIG. 65; 148/DIG. 72; 148/DIG. 76; 148/DIG. 84; 148/DIG. 110; 148/DIG. 119; 357/16; 357/61
[58] Field of Search ............... 148/175, 1.5, DIG. 65, 148/DIG. 72, DIG. 76, DIG. 84, DIG. 110, DIG. 119; 29/576 E, 576 B, 578, 580; 357/16, 30, 56, 61

[56] References Cited

U.S. PATENT DOCUMENTS

| | | | |
|---|---|---|---|
| 3,321,682 | 5/1967 | Flatley et al. | 357/61 X |
| 3,877,060 | 4/1975 | Shono et al. | 357/16 X |
| 3,922,553 | 11/1975 | Bachmann et al. | 148/DIG. 119 |
| 4,214,926 | 7/1980 | Katsuto et al. | 148/175 |
| 4,220,488 | 9/1980 | Duchemin et al. | 148/175 |
| 4,481,523 | 11/1984 | Osaka et al. | 357/16 X |

FOREIGN PATENT DOCUMENTS

| | | | |
|---|---|---|---|
| 1009581 | 7/1974 | Japan | 357/16 |
| 2072182 | 12/1975 | Japan | 357/16 |

OTHER PUBLICATIONS

Fank et al, "Device Development of MM-Waves", Microwave Journal, Jun. 1979, pp. 86-91.
Kroemer, H., "Heterostructure Bipolar Transistors . . . Circuits", Proc. IEEE, vol. 70, No. 1, Jan. 1982, pp. 13-25.

Primary Examiner—William G. Saba
Attorney, Agent, or Firm—James R. Ignatowski; Russell C. Wells

[57] ABSTRACT

A heterojunction bipolar transistor having an n— type epitaxial indium phosphide collector layer grown on a semi-insulating indium phosphide substrate with an n+ buried layer, a p— type indium phosphide base and an epitaxial, n— type boron phosphide wide gap emitter. The p— type base region is formed by ion implantation of magnesium ions into the collector layer. The transistor is applicable to millimeter wave applications due to the high electron mobility in the indium phosphide base. The wide gaps of both the boron phosphide (2.2 eV) and indium phosphide (1.34 eV) permit operation up to 350° C. The transistor is easily processed using metal organic-chemical vapor deposition (MO-CVD) and standard microelectronic techniques.

13 Claims, 7 Drawing Figures

METHOD OF FORMING AN INDIUM PHOSPHIDE-BORON PHOSPHIDE HETEROJUNCTION BIPOLAR TRANSISTOR

This application is a division of application Ser. No. 484,762, filed Apr. 14, 1983, now U.S. Pat. No. 4,529,996.

BACKGROUND OF THE INVENTION

1. Field of the Invention

The invention is related to the field of bipolar transistors and in particular to a bipolar indium-phosphide transistor having a boron phosphide wide gap emitter.

2. Prior Art

Group III-V compound semiconductor transistors are known in the art. Although the solid state industry has been concentrating on the development of gallium arsenide transistors, indium phosphide and boron phosphide transistors separately have been given some attention. Williams et al in U.S. Pat. No. 3,054,936 discloses boron phosphide p-n junction transistors. However, transistors made with boron phosphide alone have low channel mobility and are not suitable for high frequency (microwave) applications. Additionally Katsuto et al in U.S. Pat. No. 4,214,926 disclose doping techniques for boron phosphide films grown on silicon substrates and Japanese Pat. Nos. 1009-582 and 2072-182 describe boron phosphide-silicon heterojunction transistors. Flatley et al in U.S. Pat. No. 3,321,682 disclose diffusion processing techniques for gallium phosphide and indium phosphide while Frank, Crowley and Berenz in their article "Device Development for mm-Waves" Microwave Journal, June 1979, describe the advantages of indium phosphide devices for millimeter wave applications. This article deals mainly with two terminal devices and Gunn Oscillators for millimeter (mm) wave applications.

The theory of wide gap emitters is presented by Kroemer in his article "Theory of a Wide Gap Emitter for Transistors" *Proceedings of the IRE*, November 1957. Kroemer discloses that the "injection defecit" can be reduced by several orders of magnitude if the emitter has a higher band gap than the base region. Kroemer in a second article "Heterostructure Bipolar Transistors and Integrated Circuits," *Proceedings of the IEEE*, Vol. 70 No. 1 January 1982 and Dumke, Woodall and Rideout in their article "GaAs-GaAlAs Heterojunction Transistor for High Frequency Operations" *Solid State Electronics* Vol. 15 1972 disclose the use of wide gap emitters for high frequency application. Both articles are primarily directed to gallium arsenide technology but Kroemer indicates the principle may be applicable to lattice matched III/V compound semiconductor heterosystems.

The invention is a novel indium phosphide-boron phosphide heterojunction bipolar transistor with a wide gap emitter.

SUMMARY OF THE INVENTION

The indium phophide-boron phosphide heterojunction bipolar transistor has a epitaxial n— type indium phosphide collector deposited on the surface of a semi-insulating indium phosphide substrate. A buried n+ indium phosphide layer is formed between the collector layer and the substrate to reduce the collector series resistance. A p— type base region is formed in the upper surface of the collector layer by ion implantation of magnesium or beryllium. A wide gap n— type boron phosphide emitter and an n+ type boron phosphide emitter contact region are grown over the surface of the p— type base using a low temperature metal organic chemical vapor deposition technique. Collector and base contact regions are formed in the collector layer by ion implantation of silicon and magnesium respectively. The transistor is completed by depositing metal electrodes over the respective collector, base and emitter contact regions through openings in an insulating layer overlaying the surface of the transistor.

The use of a wide gap boron phosphide emitter in the indium phosphide-boron phosphide heterojunction bipolar transistor offers the advantage of a higher transconductance leading to millimeter wave applications. Other advantages include high breakdown voltage, low leakage and small parasitic capacitance and resistance. This and other advantages of the indium phosphide-boron phosphide transistor will become more apparent from reading the specifications in connection with the appended figures.

DETAILED DESCRIPTION OF THE INVENTION

Figure 1:
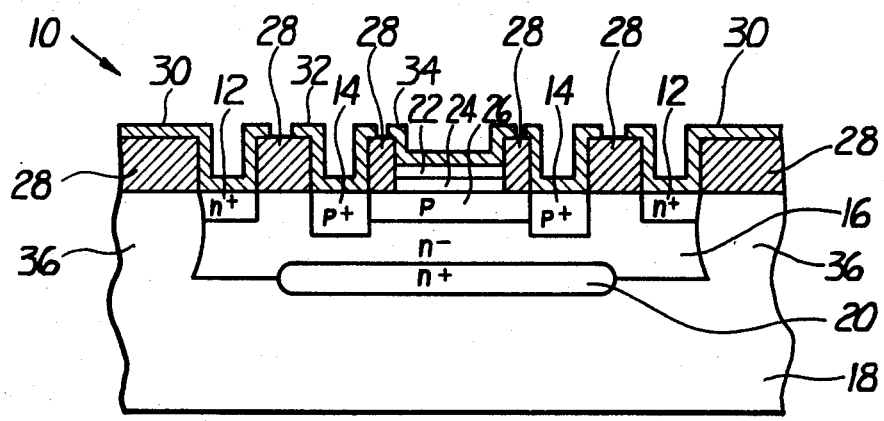
FIG. 1 is a simplified (not to scale) cross sectional view of the transistor.

The details of the indium phosphide bipolar transistor having a wide gap emitter are shown in FIG. 1. Referring to FIG. 1 the transistor 10 has an epitaxial collector layer 16 grown on a semi-insulating indium phosphide substrate 18 and includes an n+ indium phoshide collector contact region 12 about its periphery and a buried n+ layer 20 formed at the interface between the collector layer 16 and the substrate 18. The buried n+ layer 20 reduces the collector series resistance, reduces the interface effects of the collector layer 16 with the substrate 18 and inhibits the out diffusion of iron (FE) from the substrate 18 to the collector layer 16. A p— indium phosphide base region 26 and a p+ indium phosphide base contact regions 14 are implanted in the central region of the n— indium phosphide layer 16 as shown.

An epitaxial n— type boron phosphide emitter 24 is grown over the p— type indium phosphide region 26 created by implantation in the n— type indium phosphide collector layer 16. An n+ boron phosphide (BP) emitter contact region 22 is deposited over the epitaxial n— type boron phosphide wide gap emitter 24. An insulating layer 28 having openings exposing the collector contact region 12, base contact region 14, and emitter contact region 22 is deposited over the top surface of the transistor. Electrical contact to the collector contact region 12, base contact region 14 and emitter contact region 22 is made by evaporated metal alloy electrodes 30, 32, and 34 respectively. Isolation of the transistor 10 may be achieved by implanting boron (B) in the region 36 surrounding the active elements or by mesa etching as is known in the art.

The wide gap emitter bipolar transistor shown in FIG. 1 has potential applications in microwave communications. It can be used as an active component in low noise receivers and medium power amplifiers. Due to the wide gap emitter, the transistor also offers excellent high speed switching in digital circuits. The ability to integrate the wide gap emitter bipolar transistor with optoelectronic devices, such as indium gallium arsenide laser diodes, photodetectors and light emitting (LED) diodes, fabricated on a common semi-insulating indium phosphide substrate offers the possibility of optical communication with giga-bit rates.

Figure 2:
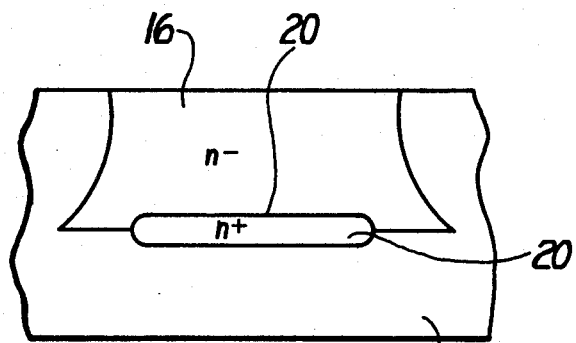
FIGS. 2 through 5 are simplified cross sectional view of the transistor at various stages in the fabrication process.

The fabrication procedure for the wide gap emitter bipolar transistor will now be explained with reference to FIGS. 1 through 5. Referring first to FIG. 2, the buried n+ layer 20 and n− type collector layer 16 are epitaxially grown on the semi-insulating indium phosphide substrate 18 using metal-organic chemical vapor deposition (MO-CVD) techniques similar to that described in the paper by K. P. Pande and A. Seabaugh "Preparation of Device Quality GaAs Using Plasma-Enhanced MO-CVD Technique" presented at the Electrochemical Society Conference "III-IV Opto-Electronics and Device Related Processes" May 1983. The substrate 18 has a thickness of approximately 100 micrometers permitting rapid dissipation of the heat generated during amplification. The buried n+ layer 20 may be formed by reacting phosphine with triethylindium and using sulphur chloride ($S_2Cl_2$) as the dopant source in a MO-CVD system. The n+ buried layer is grown in selectively etched areas of the semi-insulating substrate. The buries n+ layer 20 is grown to a thickness from 1 to 2 micrometers and has a carrier concentration of approximately 2 to $5 \times 10^{18}$ cm$^{-3}$. In a like manner the n− type indium phosphide collector layer 16 is epitaxially grown over the buried n+ layer 20. The indium phosphide collector layer 16, by nature, is of the n− type and its carrier concentration can be adjusted to $2 \times 10^{15}$ cm$^{-3}$ using sulfer chloride as the dopant source. The collector layer 16 is grown to a thickness between 0.5 and 1.0 micrometers to reduce the transit time of the carriers drifting through the collector junction. The doping is intentionally kept low to minimize the collector capacitance ($C_c$).

Figure 3:
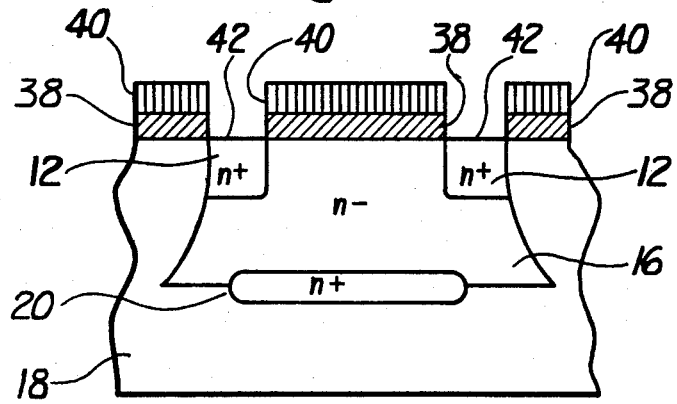

Referring now to FIG. 3, the collector layer 16 is coated with a silicon dioxide ($SiO_2$) layer 38 grown by plasma enhanced CVD techniques approximately 2000 Å thick and overlayed with a 1 micrometer thick film of photoresist 40. The photoresist 40 and silicon dioxide layer are then processed using conventional photolithography techniques to expose a surface area 42 of the collector layer 16 corresponding to the collector contact region 12. The exposed surface area 42 is then implanted with silicon (Si+) to form the n+ collector contact region 12. During this implantation the base, base contact, and emitter regions 26, 14 and 24 respectively are protected by the silicon dioxide layer 38 and photoresist film 40. The collector contact region 12 has a carrier concentration of about 2 to $5 \times 10^{18}$ cm$^{-3}$.

Figure 4:
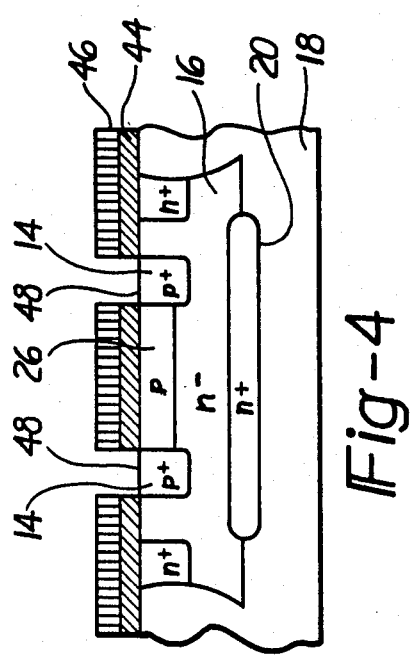

The remainder of the silicon dioxide layer 38 and photoresist film 40 are then removed and a second silicon dioxide layer 44 (approximately 500 angstroms) and photoresist film 46 are deposited over the surface of collector layer 16. The photoresist film 46 and silicon dioxide layer 44 are then processed using known lithography techniques to expose a surface area 48 of the collector layer 16 corresponding to the base contact region 14 as shown in FIG. 4. The central collector region is then implanted with high energy (200 keV) magnesium (Mg) or beryllium (Be) impurity ions at a dose of approximately $8 \times 10^{12}$ cm$^{-2}$ through the silicon dioxide layer 44 and photoresist film 46 to create the p− type indium phosphide base region 26 having a carrier concentration of approximately 6 to $8 \times 10^{17}$ cm$^{-3}$. The implantation energy is then reduced to approximately 40 keV and the dose increased to $1 \times 10^{14}$ cm$^{-2}$ ions to create the p+ base contact region 14 in the base region 26 under the exposed surface area 48 having a carrier concentration of greater than $1 \times 10^{18}$ cm$^{-3}$. The lower implantation energy is used for the p+ base contact region 14 so that the impurity ions with high dose cannot penetrate the silicon dioxide layer 44 and photoresist film 46 covering the base region.

Figure 5:
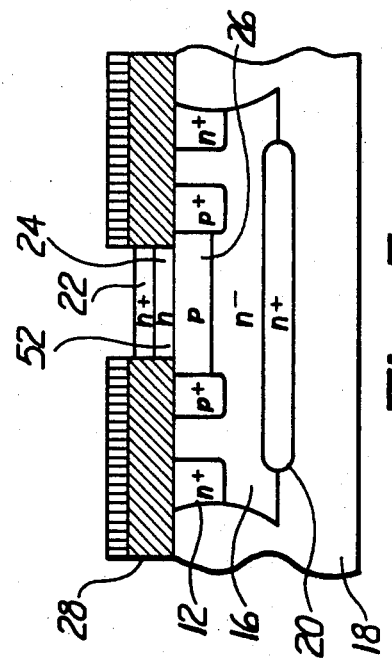

After implanting the p+ type base contact region 14, the remainder of the silicon dioxide layer 44 and photoresist film are again removed and the substrate annealed for a short time by transient radiation and capless annealing techniques to remove the implant damage. Next the silcon dioxide layer 28 is again deposited over the whole substrate and etched to expose a surface area 52 of the base region 26 corresponding to the emitter region 24 as shown in FIG. 5. A heterojunction n− type boron phosphide wide gap emitter 24 is then grown over the exposed surface area 52 of the base region 26 by vapor phase reaction of triethyl boron (liquid) or trimethyl boron (gas) with phosphine. Hydrogen may be used as a carrier gas permitting the deposition to be achieved at 500° C. or lower temperatures. Alternatively the n− type boron phosphide emitter 24 may be deposited by chemically reacting phosphine and diborane at temperatures greater than 500° C. The partial pressure of the phosphine is controlled to produce a carrier concentration of approximately 1 to $2 \times 10^{18}$ cm$^{-3}$ in the wide gap boron phosphide emitter 24.

An n+ boron phosphide emitter contact region 22 subsequently grown over the n− boron phosphide emitter 24. Like with the n− boron phosphide emitter 24, the partial pressure of the phosphine is controlled to produce the n+ boron phosphide emitter contact region 24 having a carrier concentration of greater than $10^{19}$ cm$^3$. If desired the layers can be doped with $S_2Cl_2$ to achieve this doping density.

Openings are then etched through the silicon dioxide layer 28 to expose the collector contact region 12 and base contact region 14 as shown in FIG. 1. Electrodes 30 and 34 are then formed by thermally evaporating a gold-germanium-nickel alloy over the collector contact region 12 and emitter contact region 22 respectively. Electrode 32 is formed by thermally evaporating a gold-zinc-platinum alloy over the base contact region 14. An interdigitated contact scheme can be used for the emitter region to reduce current crowding effects.

Figure 7:
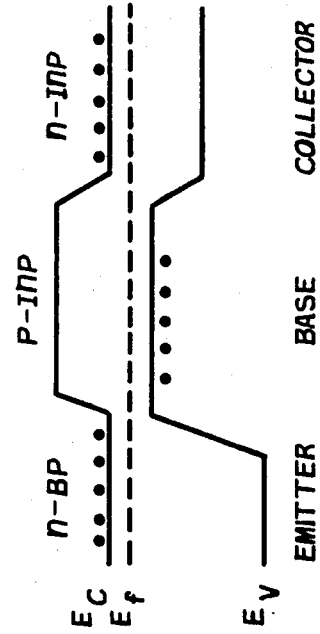
FIG. 7 is a band diagram of the transistor.
Figure 6:
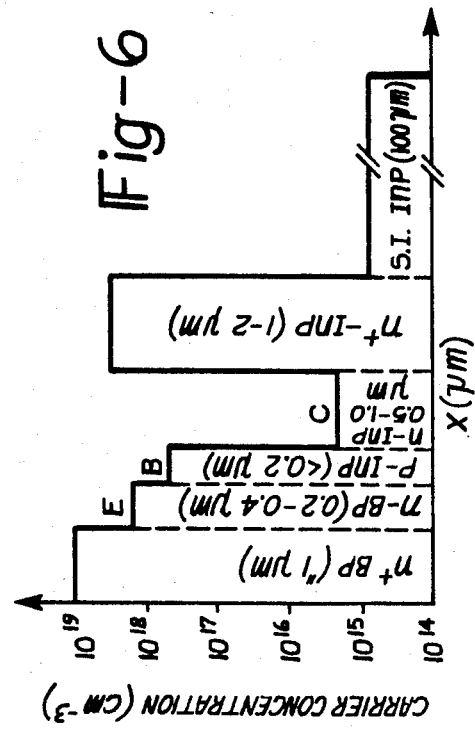
FIG. 6 is a chart showing the doping profile of the transistor.

The doping profile of the different elements and regions of the transistor 10 are shown schematically in FIG. 6 while the band diagram is shown in FIG. 7.

The advantages of the indium phosphide-boron phosphide heterojunction bipolar transistor are:

1. Better control of the threshold voltage which is determined by the band gaps of the emitter and base material.

2. Higher transconductance (gm) is achieved because this parameter is controlled by the built-in junction voltage rather than layer thickness and channel doping as in MESFETs. The higher transductance (gm) provides a higher cut-off frequency for the operation of the transistor.

3. Reduced charge storage due to a short minority carrier lifetime in the indium phosphide.

4. Interconnections and small components can be easily incorporated into high density microwave integrated circuits due to self-alignment fabrication techniques.

5. The use of sub-micron thickness for the collector depletion region and base widths makes it possible to reduce the electron transit time from emitter to the collector to produce velocity overshoot phenomena. When bas widths are lower than the mean free path, the carrier will travel without significant scattering in the base region. This permits the possibility of achieving ballistic transport in the indium phosphide, and leads to very high frequency performance. Any conduction band discontinuity at the indium phosphide-boron phosphide heterojunction will further accelerate the electrons towards the collector. With base and collector thicknesses of the order of the mean free path and the junction grading optimized, the transistor will have a very high cut off frequency of greater than 100 G Hz.

6. The transistor has a lower base parasitic resistance and small emitter-base capacitance. Low parasitic resistance and capacitance result in a high cut-off frequency and increased power gain.

7. Large current amplification ($B = i_C/i_B$) is achieved by precise control of the base region to make $i_B$ as small as possible.

8. Due to the high breakdown voltage and wide band gaps, the transistor has the ability to function well at high current densities during power amplification.

Having disclosed the wide band gap emitter indium phosphide-boron phosphide heterojunction transistor, it is recognized that those skilled in the art may conceive different processes and/or dopants for making the transistor without departing from the spirit of the invention as described herein and set forth in the appended claims.

Having described the invention, what is claimed is:

1. A method for forming a bipolar heterojunction indium phosphide transistor comprising the steps of:
   epitaxially growing a buried n+ indium phosphide layer on a selectively etched semi-insulating indium phosphide substrate;
   epitaxially growing an n− type indium phosphide collector layer over said buried n+ layer;
   implanting silicon ions into said collector layer to form an n+ collector contact region about the perimeter of said collector layer;
   implanting metal ions into the central region of said collector layer to form a p− type base region and a p+ base contact region;
   epitaxially growing an n− type boron phosphide layer over said base region to form an emitter; and
   epitaxially growing an n+ type boron phosphide layer over said emitter to form an emitter contact region.

2. The method of claim 1 wherein said steps of growing said n− type and n+ type boron phosphide layers includes the steps of:
   depositing an insulating layer over said collector layer;
   etching an opening in said insulator layer exposing a portion of said base region; and
   epitaxially growing said n− type boron phosphide and n+ boron phosphide layers over said exposed portion of said base region.

3. The method of claim 2 further including the steps of:
   etching openings in said insulating layer to expose said collector and base contact regions; and
   depositing individual metallic electrodes on the surface of said insulating layer and said collector, base, and emitter contact regions, said electrodes electrically isolated from one another and each electrode making electrical contact with a different one of said collector, base and emitter contact regions.

4. The method of claim 3 wherein said step of depositing electrodes comprises the steps of:
   thermal evaporating individual gold-germanium-nickel alloy electrodes on said collector and emitter contact regions; and
   evaporating a gold-zinc-platinum alloy electrode on said base contact regions.

5. The method of claim 1 wherein said step of growing a buried n+ layer grows said buried n+ layer to a thickness between 1 to 2 micrometers having a carrier concentration of approximately 2 to $5 \times 10^{18}$ cm$^{-3}$.

6. The method of claim 5 wherein said step of growing a buried n+ layer includes the step of chemical vapor depositing said buried n+ layer by reacting phosphine with trietylindium and using sulfer chloride as the dopant source to adjust the carrier concentration to approximately 2 to $5 \times 10^{18}$ cm$^{-3}$.

7. The method of claim 1 wherein said step of growing an n− type collector layer gorws said n− type collector layer to a thickness between 0.5 and 1.0 micrometers and having a carrier concentration of approximately $2 \times 10^{15}$ cm$^{-3}$.

8. The method of claim 7 wherein said step of growing an n− type collector layer includes the step of chemical vapor depositing said n− type collector layer by reacting phosphine with triethylindium and using sulfer chloride to adjust the carrier concentration to $2 \times 10^{15}$ cm$^{-3}$.

9. The method of claim 1 wherein said step of implanting silicon ions to form an n+ collector contact region comprises the steps of:
   depositing an insulating layer on the surface of said collector layer;
   etching said insulating layer to expose a surface area defining said collector contact region; and implanting silicon ions in said exposed surface to form said collector contact region having a carrier concentration of approximately $2 \times 10^{18}$ cm$^{-3}$.

10. The method of claim 1 wherein said step of implanting metal ions to form a p− type base region and a p+ base contact region comprises the steps of:
    depositing an insulating layer on the surface of collector layer;
    etching said insulating layer to expose a surface area of said collector layer defining said base contact region;
    implanting said base region and said base contact region with metal ions having sufficient energy to penetrate said insulator layer to form said p− type base region in said collector layer underlying said insulator region having a carrier concentration of approximately 6 to $8 \times 10^{17}$ cm$^{-3}$; and
    reducing the energy of said implanting ions to a level insufficient to penetrate said insulating layer to form said base contact region having a carrier concentration of greater than $10^{18}$ cm$^{-3}$ in the exposed portion of said collector layer.

11. The method of claim 1 wherein said metal ions are selected from a group comprising magnesium and beryllium.

12. The method of claim 1 further including the step of electrically isolating said transistor by implanting boron ions in the area surrounding said collector, base and emitter regions to render it non-conductive.

13. The method of claim 1 further including the step of electrically isolating said transistor by etching away the portion of the collector layer and buried n+ layer surrounding said collector, base and emitter regions to produce a mesa type structure.

* * * * *